United States Patent [19]

Larson

[11] Patent Number: 5,005,102
[45] Date of Patent: Apr. 2, 1991

[54] MULTILAYER ELECTRODES FOR INTEGRATED CIRCUIT CAPACITORS

[75] Inventor: William L. Larson, Colorado Springs, Colo.

[73] Assignee: Ramtron Corporation, Colorado Springs, Colo.

[21] Appl. No.: 368,668

[22] Filed: Jun. 20, 1989

[51] Int. Cl.[5] .................. H01G 1/01; H01L 3/00; H01L 27/02
[52] U.S. Cl. .................................. 361/313; 29/25.42; 357/51
[58] Field of Search ............... 29/25.42; 361/321, 323, 361/324, 303, 304, 305, 525, 311, 312, 313; 357/51

[56] References Cited

U.S. PATENT DOCUMENTS

| | | | |
|---|---|---|---|
| 3,579,063 | 5/1971 | Wasa et al. | 361/321 X |
| 3,668,484 | 6/1972 | Greig et al. | 357/51 X |
| 3,699,409 | 10/1972 | Feversanger et al. | 357/51 X |
| 4,849,801 | 7/1989 | Honjyo et al. | 356/51 |

FOREIGN PATENT DOCUMENTS

| | | | |
|---|---|---|---|
| 231784 | 12/1960 | Australia | 361/313 |
| 59-215764 | 12/1984 | Japan. | |
| 60-74556 | 4/1985 | Japan. | |

OTHER PUBLICATIONS

R. D. Huttermann et al., "Silicon Tantalum Integrated Circuit Processing," 31st Electronic Components Conference, May 11-13, 1981, Colony Square Hotel, Atlanta, Georgia, paragraphs 1-2, FIG. 2.

J. K. Howard, "Capacitor Structure for Bipolar Memory Device," *IBM Technical Disclosure Bulletin*, 5/81, pp. 5373-5374.

"TEM studies during development of a 4-megabit DRAM," *Microscopy of Semiconducting Materials*, 1987, Proceedings of the Institute of Physics Conference, Oxford, UK, 6-8, April 1987, abstract, paragraph 5.

I. Stoev and F. Schumacher, "Preparation and RF Properties of MIS Mesa Varacters", *Journal of the Asia Electronics Union*, 8/7/73, abstract, paragraphs 1-2.

*Primary Examiner*—Donald A. Griffin
*Attorney, Agent, or Firm*—Edward D. Manzo

[57] ABSTRACT

Disclosed is a multilayer capacitor structure in an integrated circuit, including a first electrode constructed by forming at least one layer over a substrate and forming a plate layer over the previous layer(s). A dielectric layer is formed over this first electrode, and a second electrode is established over the dielectric layer by forming a plate layer over the dielectric layer, and forming at least one additional layer over the plate layer. Each layer may serve one or more functions. Also disclosed is a further embodiment including constructing a first electrode by forming at least one layer on a substrate, forming a plate layer over the previous layer(s), and forming a dielectric layer over the first electrode. The resulting structure is then heated, preferably in an oxygen ambient, to oxidize the lower layer. A second electrode can then be formed over the dielectric layer.

8 Claims, 1 Drawing Sheet

MULTILAYER ELECTRODES FOR INTEGRATED CIRCUIT CAPACITORS

BACKGROUND OF THE INVENTION

The present invention relates generally to integrated circuit fabrication. In particular, the present invention relates to a multilayer electrode structure for capacitors in integrated circuits.

In the manufacture of ferroelectric or high dielectric constant capacitors, two single layer electrodes are separated by a dielectric to form the capacitor. Each electrode is made of a single material or composition, such as platinum, aluminum or silver.

All components or devices on each integrated circuit must meet several requirements in high volume manufacturing of integrated circuits. Such requirements include good adhesion characteristics, high electrical conductivity, etchability in plasma, etchability in reactive ion etchers, oriented lattice planes for proper dielectric film growth, resistance to oxidation, resistance to diffusion and low cost. The standardly selected materials for capacitor electrodes, platinum, aluminum and silver, may meet some of these requirements, but do not meet all of these requirements in the many different applications of capacitors in integrated circuits.

Thus, it is a primary object of this invention to provide a capacitor electrode for integrated circuits which meets all of these requirements.

SUMMARY OF THE INVENTION

These and other objects and advantages are achieved by forming a multilayer capacitor structure in an integrated circuit. According to one aspect of the invented method, a first electrode is constructed by forming at least one layer over a substrate and forming a plate layer over the previous layer(s). A dielectric layer is formed over this first electrode. A second electrode is established over the dielectric layer by forming a plate layer over the dielectric layer, and forming at least one additional layer over the plate layer. Each layer may serve one or more functions.

A further embodiment includes constructing a first electrode by forming at least one layer on a substrate and forming a plate layer over the previous layer(s). A dielectric layer is formed over the first electrode. The resulting structure is then heated, preferably in an oxygen ambient, to oxidize the lower layer. A second electrode is then formed over the dielectric in the reverse order of the first electrode.

Regardless of the method chosen for fabrication, the invention also includes a capacitor structure wherein one plate is separated from another plate by a dielectric, as in the past, but wherein at least one plate has multiple layers. Illustratively, an electrode may comprise a plate layer, a diffusion barrier, and an electrical contract layer. Each layer may be distinct from the others. Moveover, if the plate is to contact a semiconductor substrate, an adhesion layer may be included close to the substrate, and preferably as the bottommost layer of the bottom electrode.

The substances used may include, for example in the bottom electrode, titanium, titanium nitride and platinum. The dielectric layer may be a standard dielectric or a ferroelectric layer. The substances in the top electrode may include, for example, platinum, titanium and aluminum.

BRIEF DESCRIPTION OF THE DRAWINGS

In describing the present invention, reference is made to the accompanying drawings wherein.

DETAILED DESCRIPTION OF THE PREFERRED EMBODIMENTS

Figure 1:
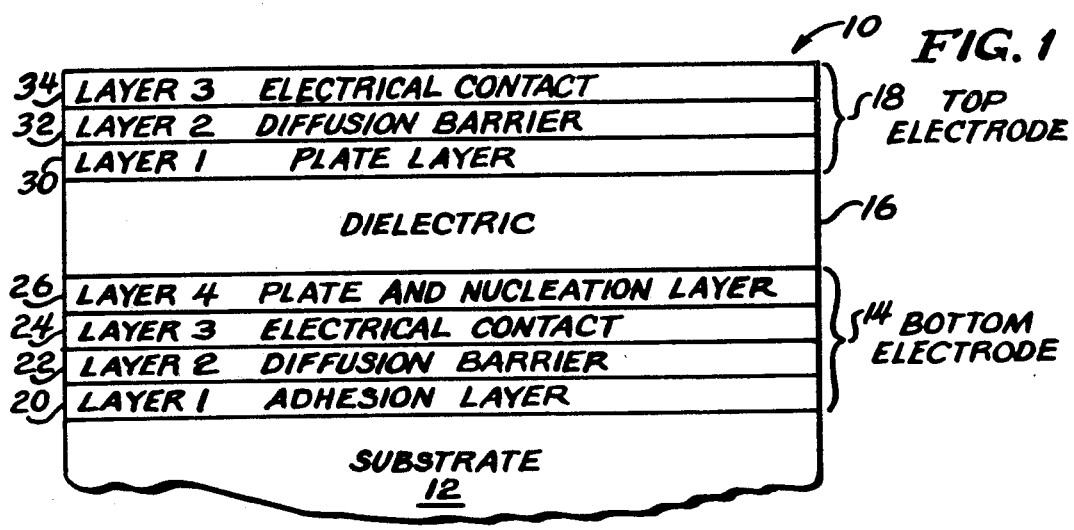
FIG. 1 illustrates a sectional view of a capacitor constructed according to the present invention.

Referring to FIG. 1, a general illustration of one capacitor according to this invention is shown, in sectional view. It is customary to construct integrated circuit capacitors on substrates, and the illustrated and described embodiments are along these lines. It will be understood, though, that the multiple layer invention can find applicability in other capacitor orientations. Thus, for illustrative purposes, a multilayer capacitor, shown generally at 10, is built on a substrate 12 of an integrated circuit device. Capacitor 10 generally comprises a first or bottom electrode 14, a dielectric 16 and a second or top electrode 18 as is known in the art. Both the bottom electrode 14 and the top electrode 18 are constructed of multiple layers according to this invention. In general, as illustrated in FIG. 1, bottom electrode 14 is constructed, for example, of four distinct layers of materials, each layer serving a different function. It is to be understood, however, that this embodiment is merely an example of one capacitor according to this invention, and a greater or lesser number of layers in each electrode will be in keeping with this invention.

A first layer 20 of bottom electrode 14 preferably comprises an adhesion layer. Layer 20 promotes adhesion of bottom electrode 14, and hence entire capacitor 10, to substrate 12. On top of adhesion layer 20, a second layer 22 is formed. Second layer 22 preferably comprises a diffusion barrier. The diffusion barrier layer 22, as is known in the art, prevents an upper or further layer of material from diffusing or migrating into the lower layers, by hillocks for example, thus causing unintended electrical paths and impurities in the lower layers.

A third layer 24 may be an electrical contact layer, which electrically connects capacitor 10 to other devices and components on the integrated circuit.

A fourth layer 26 may be formed over the other layers in bottom electrode 14. Layer 26 may be a plate layer which provides the electrode or plate function as usually found in a capacitor. In this embodiment, layer 26 may also provide a nucleation layer, as will be explained infra, for dielectric growth.

Continuing in the upward direction through the FIG. 1 capacitor, dielectric 16 is grown, deposited or otherwise established on first or bottom electrode 14, as is known in the art.

A second or top electrode 18 may be constructed of multiple layers on top of dielectric layer 16, and the structure of the second electrode 18 can be similar to the layering structure of the first electrode 14, but in mirror image. That is to say, bottom layer 30 of electrode 18 may be a plate layer formed over dielectric 16. A second layer 32 of second electrode 18 may be formed over the plate layer 30. This second layer 32 of the second electrode may be a diffusion barrier, as is known in the art and discussed supra in connection with layer 22 of the bottom electrode.

A third layer 34 of the second or top electrode 18 may be formed over layer 32. Layer 34 may be, for example, a second electrical contact forming a circuit or connection with other components or devices situated nearby (or elsewhere) on the integrated circuit. Further layers of the integrated circuit may then be formed on capacitor 10, as is known in the art.

Figure 2:
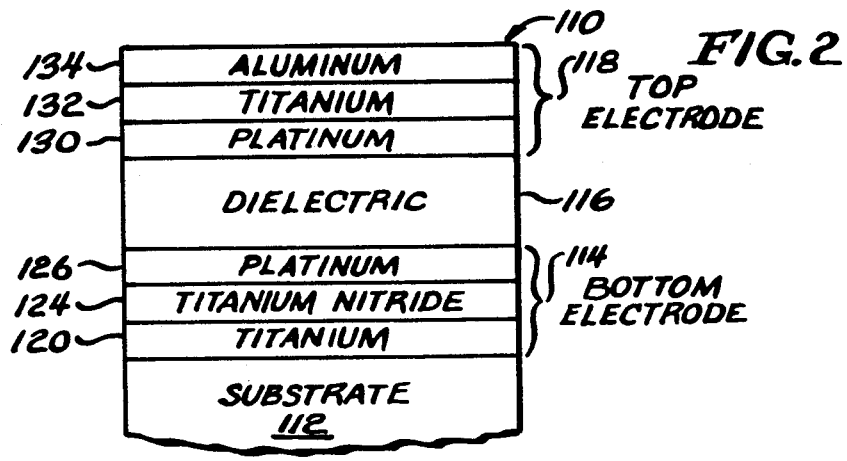
FIG. 2 illustrates a sectional view of an example of a capacitor constructed according to FIG. 1.

FIG. 2 shows a sectional view of a more specific embodiment of the current invention, showing the various layers and the materials that may be used to fabricate a multilayer capacitor. The capacitor of the FIG. 2 embodiment is shown generally at 110. Capacitor 110, like capacitor 10 of FIG. 1, is constructed on a substrate 112 of an integrated circuit, and includes a first or bottom electrode 114, a dielectric 116 thereover, and a second or top electrode 118 spaced from bottom electrode 114 by dielectric 116. Both electrodes 114 and 118 are constructed in a multilayer fashion, according to this invention.

The embodiment of FIG. 2 is constructed in an evacuated chamber, as is known in the art, preferably in two separate evacuations or "pump downs" of the chamber. The first or bottom electrode and the dielectric layer is constructed during the first pump down, and the second or upper electrode is constructed during the second pump down. In the following description, all thicknesses may vary approximately +100% to −50%.

In the embodiment illustrated in FIG. 2, bottom electrode 114 comprises three layers over the substrate 112. Substrate 112 may comprise an insulator material on a semiconductor substrate, for example $SiO_2$ deposited on Si or GaAs. Substrate 112 may alternatively comprise a semiconductor material, such as the drain of a MOS transistor or the emitter of a bipolar transistor.

The first layer 120 may comprise titanium, which serves as an adhesion layer between the substrate 112 and the capacitor 110. Titanium layer 120 is established as discussed below to a preferred thickness of approximately 0.05 microns.

A second layer 124 of electrode 114 may comprise, for example, titanium nitride. This serves as an electrical contact between the bottom electrode 114 of the embodiment of FIG. 2 and other devices on the integrated circuit, and as a diffusion barrier. The titanium nitride second layer 124 is deposited to a preferred thickness of approximately 0.1 microns.

A third layer 126 of electrode 114 may comprise platinum, which serves several functions. Platinum layer 126 can act as an electrode plate; platinum is a good material for nucleation of a dielectric layer 116; and platinum is a chemically inert interface between dielectric layer 116 and electrically conductive layer 124. The platinum third layer is deposited via known means, to a preferred thickness of approximately 0.05 microns. The first electrode 114 is substantially complete at this point.

The next layer in the capacitor is dielectric layer 116. This layer may be deposited by means known in the art, or may be grown as is known in the art. The dielectric may be a ferroelectric material or a high dielectric constant material. The thickness of the dielectric layer depends on the material chosen. The thickness of a high dielectric constant material would vary inversely according to the desired capacitance of the capacitor. The thickness of a ferroelectric layer depends on the operating voltage of the underlying circuit. For a typical operating voltage of approximately 5 volts, the ferroelectric layer is approximately 0.4 microns.

On the dielectric 116 may be deposited a first layer 130 of the second or top electrode 118. Layer 130 may be constructed of platinum, for example. The platinum layer 130 serves as the top electrode plate and acts as a chemically inert interface between the dielectric 116 and a conductor layer. Platinum layer 130 of the second electrode 118 is deposited by means known in the art to a preferred thickness of approximately 0.05 microns.

Next, a second layer 132 is deposited or otherwise established over first layer 130, and preferably comprises titanium. The titanium layer 132 serves as a diffusion barrier and adhesion layer in the top electrode 118. The titanium layer 132 is deposited by known means to a preferred thickness of approximately 0.1 microns.

The third layer in the top electrode 118 of the embodiment of FIG. 2 is constructed preferably of aluminum. The third layer 134 of aluminum serves as the top electrode's electrical contact to other devices on the integrated circuit. The aluminum third layer is deposited to a preferred thickness of approximately 0.1 microns.

As mentioned supra, each layer in both the top and bottom electrodes can be deposited or established a number of known techniques. The technique needs only to be appropriate to the material selected for the layer and the surrounding components. Appropriate methods include, but are not limited to, sputtering, evaporation, chemical vapor deposition, molecular beam epitaxy and spin coating. In addition, the final form of a multilayer electrode structure can be achieved by a controlled chemical reaction of the deposited or grown layers.

Figure 3:
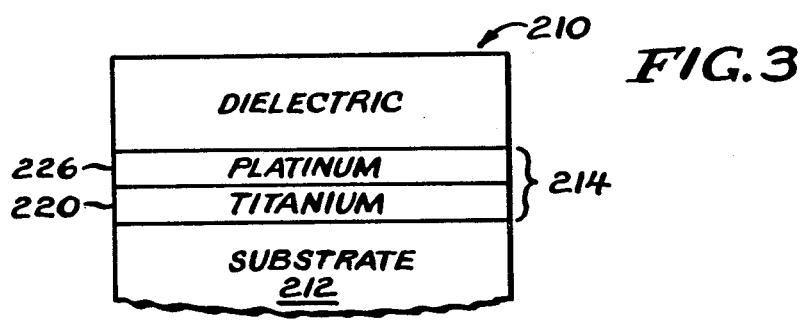
FIG. 3 illustrates a sectional view of a second embodiment of a capacitor embodying the present invention, in partially constructed form.
Figure 4:
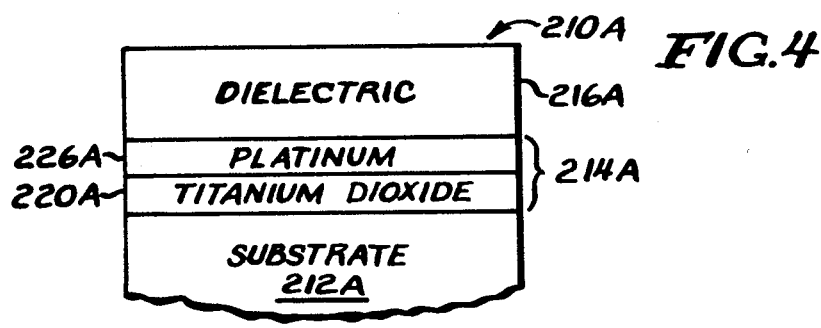
FIG. 4 illustrates a sectional view of the same capacitor shown in FIG. 3, still in partially completed form, but in a step of construction subsequent to FIG. 3.

Turning now to FIGS. 3 and 4, a further embodiment of this invention is shown, whereby a multilayer structure is created by a controlled chemical reaction of the deposited layers. A partially completed capacitor according to this embodiment of the invention is shown in section in FIG. 3, generally at 210. The capacitor 210 of this embodiment is built on a substrate 212, and includes a first or bottom electrode 214, a dielectric 216 thereover and an upper electrode, not shown in this figure. The deposition of material in this embodiment is preferably performed in one pump down. In this embodiment, a first layer of titanium 220 may be deposited by a means known in the art, as discussed above, onto the substrate 212. The first layer of titanium 220 is preferably 0.15 microns (all thicknesses of this embodiment may also vary approximately +100% to −50%).

A second layer 226 of platinum is deposited over the first layer 220 to a preferred thickness of 0.05 microns. A dielectric layer 216 is next deposited on the platinum second layer 226, as in the preferred embodiment, above.

Turning now to FIG. 4, the structure thus formed in FIG. 3 is heated in an oxygen ambient to approximately 750 degrees Centigrade. As a result, the titanium first layer 220 in FIG. 3 becomes titanium dioxide 220A in FIG. 4. The substrate 212A, the platinum second layer 226A and the dielectric layer 216 remain relatively unaffected by this step, as illustrated in FIG. 4. A top or second electrode is then formed in an identical or similar manner.

The oxidation of the titanium layer 220 of FIG. 3 results in an improvement in adhesion of the platinum and lowered film stress. Other layers may be added to the multilayer electrode of this embodiment, depending on the circuit, connections required, etc.

Thus, it will be appreciated that in the preferred embodiments, both layers of a capacitor on an integrated circuit are formed of two or more distinct layers, each layer performing one or more functions. Of course, it is not required that both electrodes be so formed, as a given application may call for only one electrode to be multiply-layered according to this invention.

Those skilled in the art will find other modifications of these embodiments which are within the scope and spirit of the present invention. The foregoing descriptions of two embodiments are illustrative.

What is claimed as the invention is:

1. A method for fabricating a multilayer electrode capacitor on an integrated circuit comprising the steps of:
    constructing a first multilayer electrode including the steps of (a) forming a conductive adhesion layer on a substrate, (b) forming a conductive diffusion barrier on said adhesion layer, (c) forming a further electrical conductive layer on said diffusion barrier, and (d) forming a plate and nucleation layer on said further electrical conductive layer;
    forming an insulative dielectric layer on said first multilayer electrode; and
    constructing a second multilayer electrode by (a) forming a second plate layer on said dielectric, (b) forming a second conductive diffusion barrier on said second electrode, and (c) forming a second further electrical conductive layer on said second diffusion barrier.

2. The method of claim 1 wherein said forming steps of said first multilayer electrode comprise forming a lower layer and a conductive diffusion layer thereover, and then reacting said lower layer to form said conductive adhesion layer and constructing said second multilayer by forming a second conductive diffusion layer on said second electrode and then reacting said second electrode.

3. A capacitor for an integrated circuit comprising:
    first and second electrodes;
    a dielectric located between said electrodes;
    one of said electrodes comprising a plate layer adjacent to said dielectric and a further layer, wherein said further layer comprises a layer of titanium and a layer of titanium nitride.

4. The capacitor of claim 3 wherein said further layer further includes a layer of aluminum.

5. A method for fabricating a capacitor on an integrated circuit including the steps of forming first and second electrodes separated by a dielectric material, wherein one of said electrodes is constructed by (a) forming at least one electrically conductive layer, (b) forming a plate layer on said one layer, and (c) oxidizing said one electrode whereby said at least one layer is oxidized, and wherein said plate layer is adjacent to said dielectric layer, and the other one of said electrodes is constructed by the steps of: (a) forming a second plate layer, (b) forming at least one further electrically conductive layer, and (c) oxidizing said other electrode whereby said further layer is oxidized, and wherein said second plate layer is adjacent to said dielectric layer.

6. A capacitor for an integrated circuit comprising:
    first and second electrodes; and
    a dielectric located between said electrodes;
    one of said electrodes comprising a plate layer adjacent to said dielectric and a further conductive layer, wherein said further conductive layer comprises a conductive oxide.

7. The capacitor of claim 6 wherein said conductive oxide comprises ruthenium oxide.

8. The capacitor of claim 6 wherein said plate layer comprises platinum.

* * * * *